United States Patent
Abarra et al.

(10) Patent No.: US 11,742,190 B2
(45) Date of Patent: Aug. 29, 2023

(54) SPUTTERING APPARATUS AND FILM FORMING METHOD

(71) Applicant: TOKYO ELECTRON LIMITED, Tokyo (JP)

(72) Inventors: Einstein Noel Abarra, Tokyo (JP); Hiroyuki Toshima, Yamanashi (JP); Shota Ishibashi, Yamanashi (JP); Hiroyuki Iwashita, Yamanashi (JP); Tatsuo Hirasawa, Yamanashi (JP); Masato Shinada, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/388,638

(22) Filed: Jul. 29, 2021

(65) Prior Publication Data
US 2022/0044920 A1    Feb. 10, 2022

(30) Foreign Application Priority Data

Aug. 5, 2020  (JP) .................................. 2020-132833

(51) Int. Cl.
*H01J 37/34*    (2006.01)
*H01J 37/32*    (2006.01)
*C23C 14/34*    (2006.01)
*C23C 14/35*    (2006.01)

(52) U.S. Cl.
CPC ...... *H01J 37/3447* (2013.01); *C23C 14/3464* (2013.01); *C23C 14/35* (2013.01); *H01J 37/32715* (2013.01); *H01J 37/3417* (2013.01)

(58) Field of Classification Search
None
See application file for complete search history.

(56) References Cited

U.S. PATENT DOCUMENTS

2013/0299345 A1* 11/2013 Abarra .................. C23C 14/225
                                                          204/298.11
2020/0013592 A1*  1/2020 Mazzocco ........... H01J 37/3417

FOREIGN PATENT DOCUMENTS

JP           2011-214123 A      10/2011

* cited by examiner

*Primary Examiner* — Jason Berman
(74) *Attorney, Agent, or Firm* — Fenwick & West LLP

(57) ABSTRACT

A sputtering apparatus includes a first target and a second target that emit sputter particles, a substrate support configured to support a substrate, and a slit plate disposed between the first and the second targets and the substrate and having a slit unit through which the sputter particles pass. The slit unit includes a first slit to the first and the second target side and a second slit to the substrate side. The second slit has a first protrusion and a second protrusion protruding toward the center of the second slit. When the slit unit is viewed from the first target, the first protrusion is hidden. When the slit unit is viewed from the second target, the second protrusion is hidden.

12 Claims, 9 Drawing Sheets

SPUTTERING APPARATUS AND FILM FORMING METHOD

CROSS-REFERENCE TO RELATED APPLICATIONS

This application claims priority to Japanese Patent Application No. 2020-132833, filed on Aug. 5, 2020, the entire contents of which are incorporated herein by reference.

TECHNICAL FIELD

The present disclosure relates to a sputtering apparatus and a film forming method.

BACKGROUND

There is known a sputtering apparatus for forming a film by allowing sputter particles emitted from a target to be incident on a substrate such as a wafer or the like.

Japanese Patent Application Publication No. 2011-214123 discloses a film forming apparatus including a film material source for supplying a film material forming a film to be formed on a substrate, a vacuum tank that defines a space for installing the film material source and the substrate and maintains the space in a vacuum state, a holding unit for holding the substrate such that at least a part of the substrate faces at least a part of the film material source in the space, a moving unit for moving the holding unit such that the substrate is moved along one direction, and a slit plate disposed between the substrate and the film material source and having an opening extending along another direction intersecting with the one direction. An end of the opening is deviated within a plane of the slit plate in a direction that suppresses expansion of angular distribution in another direction of the film material passing through the opening from another direction.

SUMMARY

The sputter particles are emitted from a target disposed diagonally with respect to the substrate while moving the substrate in a predetermined direction and reach the substrate through the opening of the slit member. Accordingly, an incident angle of the sputter particles is limited, and a film having directivity may be formed. Although the sputter particles are emitted from the target in all directions, since the sputter particles having a certain range of directivity are selected by the slit member, the uniformity of the film in the direction orthogonal to a sliding direction of the substrate may deteriorate. Therefore, it is required to improve the uniformity of the film in the direction orthogonal to the sliding direction of the substrate.

One aspect of the present disclosure provides a sputtering apparatus and a film forming method capable of improving controllability of an incident angle of sputter particles and improving the uniformity of a film.

In accordance with an aspect of the present disclosure, there is provided a sputtering apparatus. The sputtering apparatus comprises a first target and a second target that emit sputter particles, a substrate support configured to support a substrate, and a slit plate disposed between the first and the second targets and the substrate and having a slit unit through which the sputter particles pass. The slit unit includes a first slit to the first and the second target side and a second slit to the substrate side. The second slit has a first protrusion and a second protrusion protruding toward the center of the second slit. When the slit unit is viewed from the first target, the first protrusion is hidden. When the slit unit is viewed from the second target, the second protrusion is hidden.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
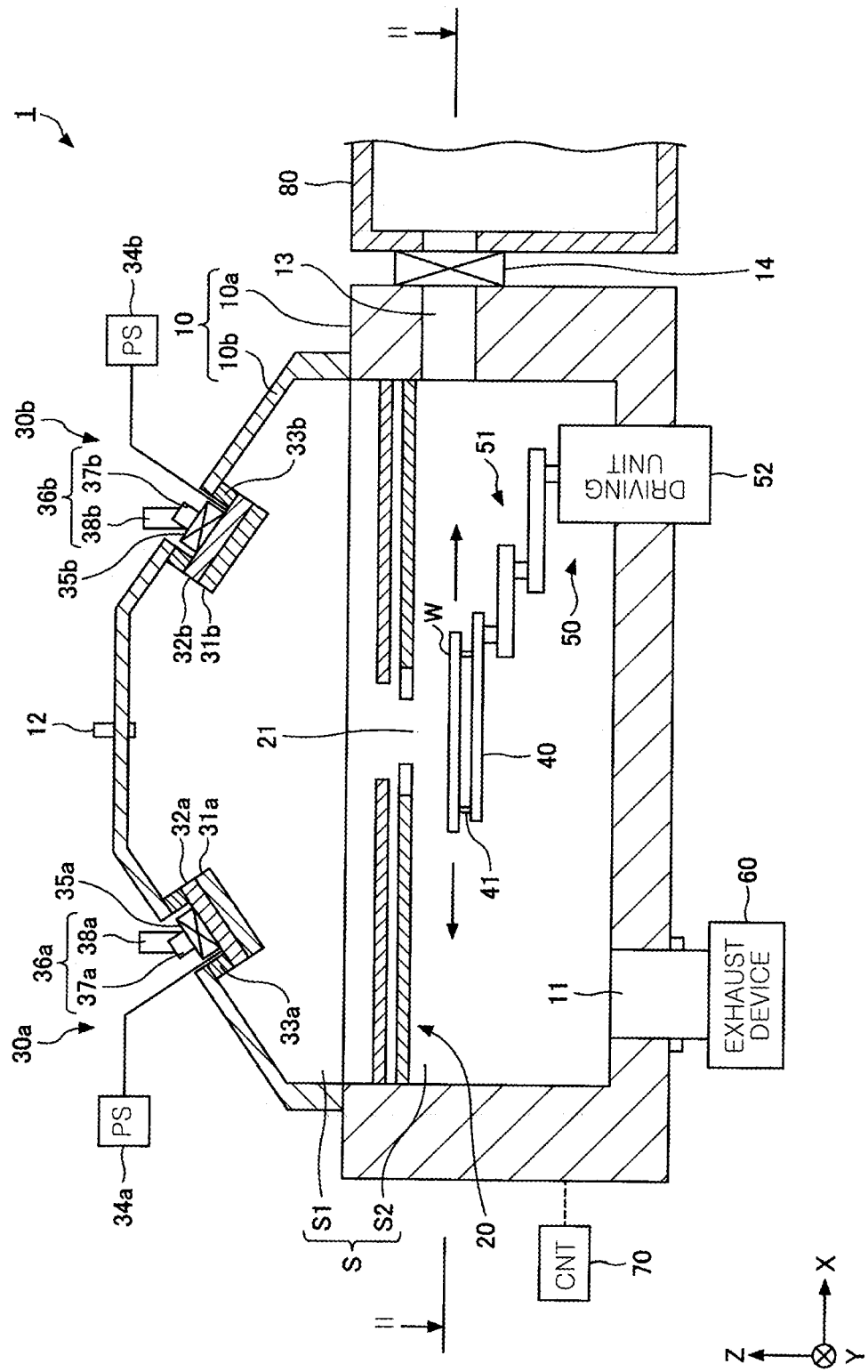
FIG. 1 is an example of a schematic cross-sectional view of a substrate processing apparatus according to a first embodiment

Hereinafter, embodiments of the present disclosure will be described in detail with reference to the accompanying drawings. Like reference numerals will be given to like or corresponding parts throughout the drawings, and redundant description thereof may be omitted.

First Embodiment

Figure 2:
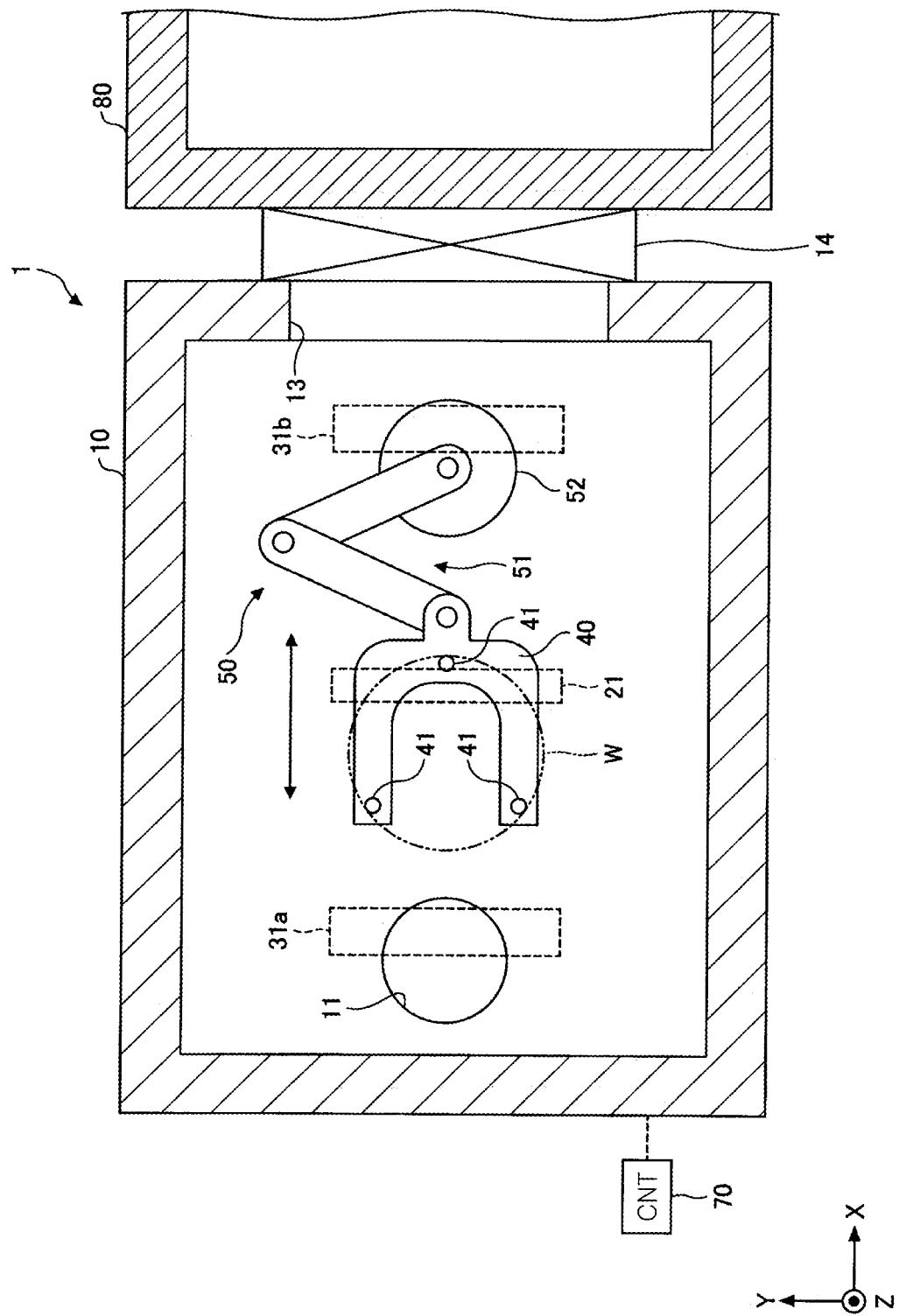
FIG. 2 is an example of a schematic cross-sectional view taken along a line II-II of the substrate processing apparatus according to the first embodiment.

A substrate processing apparatus (i.e., sputtering apparatus) 1 according to a first embodiment will be described with reference to FIGS. 1 to 2. FIG. 1 is an example of a schematic cross-sectional view of the substrate processing apparatus 1 according to the first embodiment. FIG. 2 is an example of a schematic cross-sectional view taken along a line II-II of the substrate processing apparatus 1 according to the first embodiment. In the following description, the X direction indicates one horizontal direction; the Y direction indicates a horizontal direction perpendicular to the X direction; and the Z direction indicates a vertical direction.

The substrate processing apparatus 1 includes a processing chamber 10, a slit plate 20, sputter particle emitting units 30a and 30b, a substrate support 40, a substrate moving mechanism 50, and an exhaust device 60. The substrate processing apparatus 1 is, e.g., a physical vapor deposition (PVD) apparatus, and is a sputtering apparatus for forming a film by adhering sputter particles (i.e., film forming atoms) emitted from the sputter particle emitting units 30a and 30b onto a surface of a substrate W such as a semiconductor wafer or the like placed on the substrate support 40 in the processing chamber 10.

The processing chamber 10 includes a chamber main body 10a having an upper opening, and a lid body 10b disposed to cover the upper opening of the chamber main body 10a. The lid body 10b has an inclined side surface. An inner space of the processing chamber 10 serves as a processing space S where the film formation is performed.

An exhaust port 11 is formed at a bottom portion of the processing chamber 10. The exhaust device 60 is connected to the exhaust port 11. The exhaust device 60 includes a pressure control valve and a vacuum pump. The processing space S is vacuum exhausted to a predeteimined degree of vacuum by the exhaust device 60.

A gas inlet port 12 for introducing a gas into the processing space S is inserted at the top of the processing chamber 10. A gas supply unit (not shown) is connected to the gas inlet port 12. A sputtering gas (e.g., an inert gas) supplied from the gas supply unit to the gas inlet port 12 is introduced into the processing space S.

A loading/unloading port 13 for loading/unloading the substrate W is formed on a sidewall of the processing chamber 10. The loading/unloading port 13 is opened and closed by a gate valve 14. The processing chamber 10 is disposed adjacent to a transfer chamber 80. The processing chamber 10 and the transfer chamber 80 communicates with each other by opening the gate valve 14. A pressure in the transfer chamber 80 is maintained at a predetermined degree of vacuum, and a transfer device (not shown) for loading/unloading the substrate W into/from the processing chamber 10 is disposed in the transfer chamber 80.

The slit plate 20 is formed as a substantially plate-shaped member, and is horizontally disposed at an intermediate position in a height direction of the processing space S. An edge of the slit plate 20 is fixed to a sidewall of the chamber main body 10a. The slit plate 20 divides the processing space S into a first space S1 and a second space S2. The first space S1 is a space above the slit plate 20. The second space S2 is a space below the slit plate 20.

The slit plate 20 has a slit unit 21 through which sputter particles pass. The slit unit 21 penetrates through the slit plate 20 in a plate thickness direction thereof (i.e., the Z direction). The slit unit 21 is formed in an elongated shape with the Y direction, which is one horizontal direction in the drawing, as a longitudinal direction. A length of the slit unit 21 in the Y direction is greater than a diameter of the substrate W. The slit plate 20 and the slit unit 21 will be described later with reference to FIG. 3 or the like.

The sputter particle emitting unit 30a includes a target 31a, a target holder 32a, an insulating member 33a, a power supply (PS) 34a, a magnet 35a, and a magnet scanning mechanism 36a. Further, the sputter particle emitting unit 30b includes a target 31b, a target holder 32b, an insulating member 33b, a power supply (PS) 34b, a magnet 35b, and a magnet scanning mechanism 36b.

The targets 31a and 31b are made of a material containing a constituent element of a film to be formed, and may be made of a conductive material or a dielectric material. Further, the targets 31a and 31b may be made of the same material or different materials.

The target holders 32a and 32b are made of a conductive material and are disposed above the slit plate 20 at different positions on an inclined surface of the lid body 10b of the processing chamber 10 via the insulating members 33a and 33b. In the example shown in FIG. 1, the target holders 32a and 32b are disposed at positions facing each other with the slit unit 21 interposed therebetween. However, the target holders 32a and 32b may be disposed at any position without being limited thereto. The target holders 32a and 32b respectively hold the targets 31a and 31b such that the targets 31a and 31b are positioned obliquely upward with respect to the slit unit 21.

The power supplies 34a and 34b are electrically connected to the target holders 32a and 32b, respectively. The power supplies 34a and 34b may be DC power supplies when the targets 31a and 31b are made of a conductive material. The power supplies 34a and 34b may be radio-frequency (RF) power supplies when the targets 31a and 31b are made of a dielectric material. When the power supplies 34a and 34b are the RF power supplies, they are respectively connected to the target holders 32a and 32b via a matching unit. By applying a voltage to the target holders 32a and 32b, a sputtering gas is dissociated around the targets 31a and 31b. Then, ions in the dissociated sputtering gas collide with the targets 31a and 31b, and the sputter particles that are particles of the constituent material of the targets 31a and 31b are emitted from the targets 31a and 31b.

The magnets 35a and 35b are disposed on back surfaces of the target holders 32a and 32b, and are configured to reciprocate (or oscillate) in the Y direction by the magnet scanning mechanisms 36a and 36b, respectively. The magnet scanning mechanisms 36a and 36b include, e.g., guides 37a and 37b and driving units 38a and 38b, respectively. The magnets 35a and 35b are guided by the guides 37a and 37b to reciprocate in the Y direction, respectively. The driving units 38a and 38b reciprocate the magnets 35a and 35b along the guides 37a and 37b, respectively.

The ions in the dissociated sputtering gas are attracted by magnetic fields of the magnets 35a and 35b and collide with the targets 31a and 31b. When the magnet scanning mechanisms 36a and 36b reciprocate the magnets 35a and 35b in the Y direction, respectively, the positions where the ions collide with the targets 31a and 31b, i.e., the positions where the sputter particles are emitted, are changed.

The substrate support 40 is disposed in the chamber main body 10a of the processing chamber 10 and horizontally supports the substrate W via support pins 41. The substrate support 40 is configured to be movable linearly in the X direction that is one horizontal direction by the substrate moving mechanism 50. Therefore, the substrate W supported by the substrate support 40 is linearly moved in a horizontal plane by the substrate moving mechanism 50. The substrate moving mechanism 50 includes a multi-joint arm 51 and a driving unit 52, and is configured to move the substrate support 40 in the X direction by driving the multi-joint arm 51 with the driving unit 52.

In other words, the moving directions (i.e., the Y direction) of the magnets 35a and 35b and the moving direction (i.e., the X direction) of the substrate W are orthogonal to each other. Further, the sputter particle emitting units 30a and 30b are disposed at both ends when viewed in the moving direction (i.e., the X direction) of the substrate W.

A controller (CNT) 70 is composed of a computer and controls individual components of the substrate processing apparatus 1, such as the power supplies 34a and 34b, the driving units 38a and 38b, the driving unit 52, the exhaust device 60, and the like. The controller 70 includes a main controller having a CPU for actually controlling those components, an input device, an output device, a display device, and a storage device. The storage device stores parameters of various processes executed by the substrate processing apparatus 1, and a storage medium in which a program, i.e., a processing recipe, for controlling the processes executed by the substrate processing apparatus 1 is stored, is set in the storage device. The main controller of the controller 70 calls a predetermined processing recipe stored in the storage medium, and causes the substrate processing apparatus 1 to execute a predetermined process based on the processing recipe.

Next, a film forming method in the substrate processing apparatus 1 according to the first embodiment will be described.

First, after the processing space S in the processing chamber 10 is exhausted, a sputtering gas (e.g., an inert gas) is introduced into the processing space S from the gas inlet port 12 to adjust a pressure in the processing space S to a predetermined pressure.

Next, the substrate support 40 is positioned at a substrate transfer position, and the gate valve 14 is opened so that the substrate W is placed on the substrate support 40 (on the support pins 41) by the transfer device (not shown) of the transfer chamber 80. Next, the transfer device is returned to the transfer chamber 80, and the gate valve 14 is closed.

Next, the controller 70 controls the substrate moving mechanism 50 (or the driving unit 52) to move the substrate W on the substrate support 40 in the X direction, and also controls the sputter particle emitting units 30a and 30b (the power supplies 34a and 34b and the driving units 38a and 38b) to obliquely emit sputter particles from the targets 31a and 31b.

Here, the sputter particles are emitted by applying a voltage from the power supplies 34a and 34b to the target holders 32a and 32b such that the ions in the sputtering gas dissociated around the targets 31a and 31b collide with the targets 31a and 31b. Further, the magnet scanning mechanisms 36a and 36b reciprocate the magnets 35a and 35b in the Y direction, respectively, to change the positions where the ions collide with the targets 31a and 31b, i.e., the positions where the sputter particles are emitted.

The sputter particles obliquely emitted from the targets 31a and 31b of the sputter particle emitting units 30a and 30b pass through the slit unit 21 formed in the slit plate 20 and are obliquely incident on the substrate W to be deposited thereon.

Here, uneven portions such as trenches or the like are formed on the surface of the substrate W. The substrate processing apparatus 1 perform film formation by emitting sputter particles from the target 31a while moving the substrate W in a transfer direction and selectively forms a film on corners of protrusions of the substrate W from one direction. Then, the substrate processing apparatus 1 performs film formation by emitting sputter particles from the target 31b while moving the substrate W in the transfer direction and selectively forms a film on the corners of the protrusions of the substrate W from a different direction. Accordingly, a film can be selectively formed on the protrusions of the substrate W.

The targets 31a and 31b may be made of the same material or different materials.

Slit Plate 20 of the First Embodiment

Next, the slit plate 20 of the substrate processing apparatus 1 according to the first embodiment will be described with reference to FIGS. 3 to 7.

Figure 3:
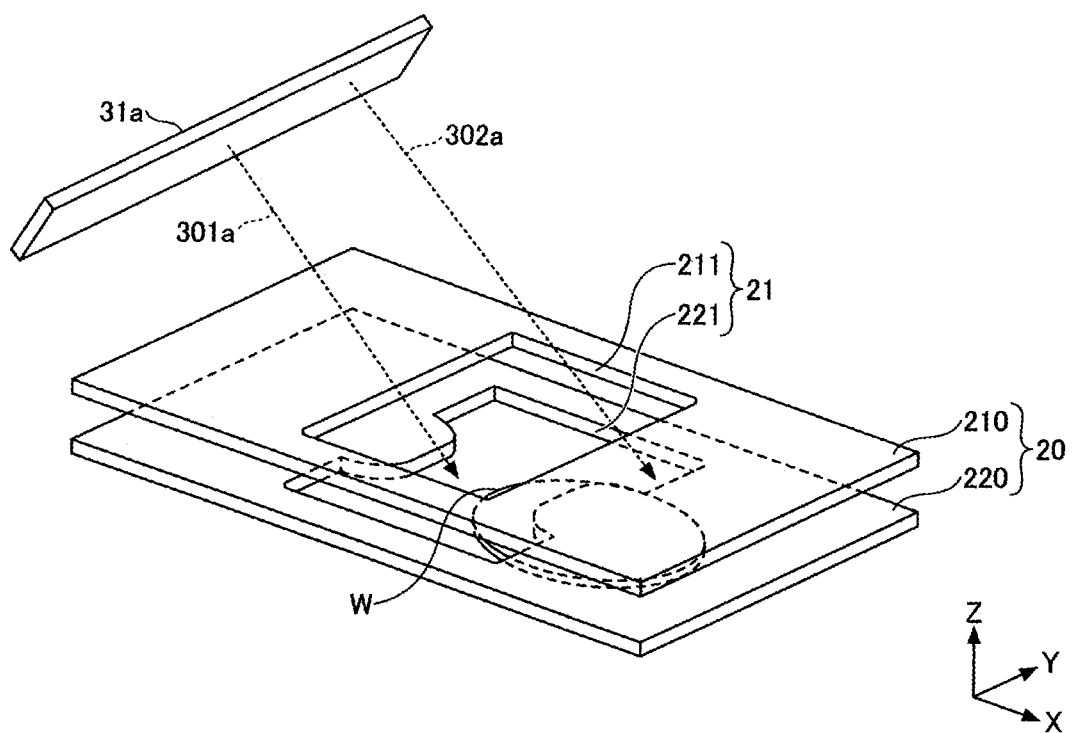
FIG. 3 is a perspective view showing an example of each of a slit plate, a target, and a substrate in the substrate processing apparatus according to the first embodiment.

FIG. 3 is a perspective view showing an example of each of the slit plate 20, the target 31a, and the substrate W in the substrate processing apparatus 1 according to the first embodiment. In FIG. 3, the target 31b is not shown. Further, examples of trajectories 301a and 302a of the sputter particles emitted from the target 31a are indicated by dashed arrows.

The slit plate 20 has a first plate 210 and a second plate 220. The first plate 210 is disposed on the targets 31a and 31b side. The second plate 220 is disposed on the substrate W side. The first plate 210 has an opening (first slit) 211. The second plate 220 has an opening (second slit) 221. The first plate 210 and the second plate 220 are disposed such that the opening 211 and the opening 221 overlap with each other in the vertical direction (i.e., the Z direction). Further, the slit unit 21 of the slit plate 20 has the opening 211 formed in the first plate 210 and the opening 221 formed in the second plate 220. The sputter particles emitted from the target 31a pass through the openings 211 and 221 as indicated by the dashed arrows to be deposited on the substrate W.

Figure 4A:
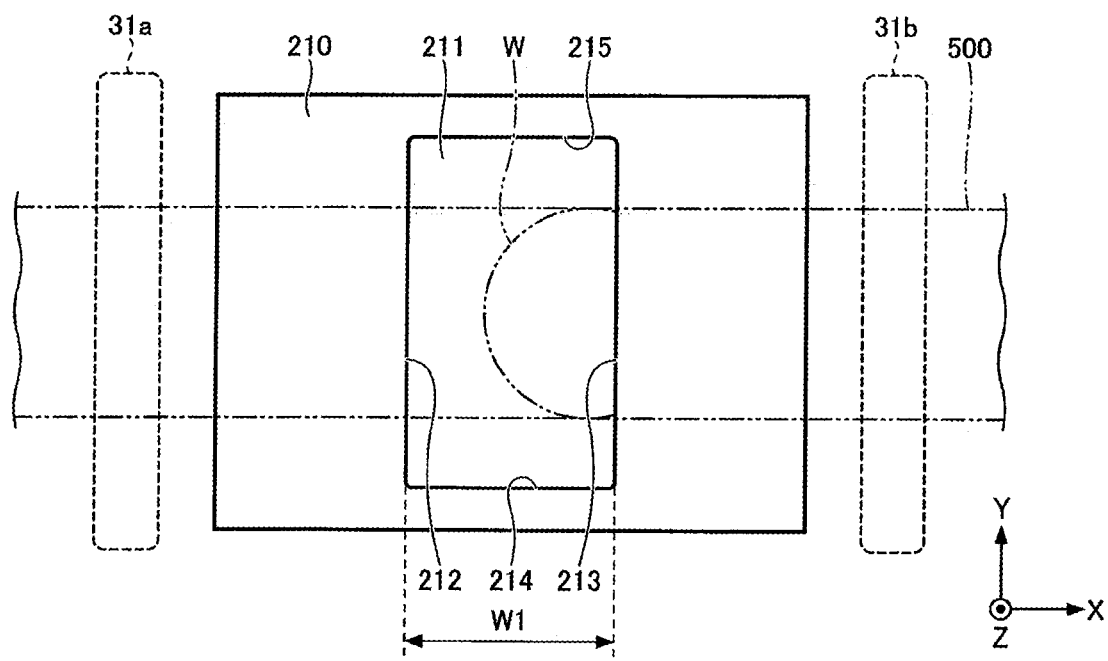
FIGS. 4A and 4B are examples of a plan view of a first plate and a second plate in the substrate processing apparatus according to the first embodiment.
Figure 4B:
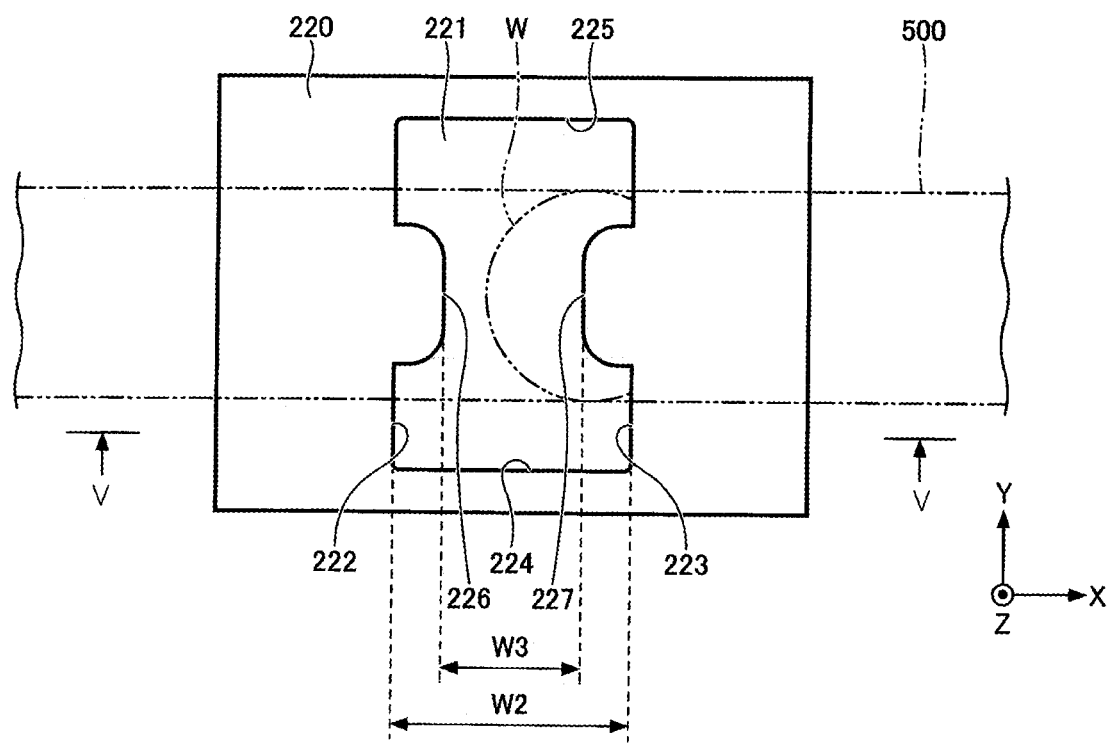

Next, the opening 211 of the first plate 210 and the opening 221 of the second plate 220 will be further described with reference to FIGS. 4A and 4B. FIGS. 4A and 4B are examples of a plan view of the first plate 210 and the second plate 220 in the substrate processing apparatus 1 according to the first embodiment.

FIG. 4A is an example of a plan view of the first plate 210. In FIG. 4A, the positions of the targets 31a and 31b projected on the first plate 210 are indicated by dashed lines. Further, an example of the substrate W transferred by the substrate moving mechanism 50 is indicated by dashed double-dotted lines. Further, an example of a trajectory 500 of the transfer path of the substrate W transferred by the substrate moving mechanism 50 is indicated by dashed double-dotted lines.

The opening 211 has a substantially rectangular shape formed by edges 212 and 213 extending in the Y direction and edges 214 and 215 extending in the X direction. Further, the opening 211 has a substantially rectangular shape with the Y direction as a longitudinal direction and the X direction as a lateral direction. The edges 212 and 213 intersect with the trajectory 500 of the transfer path of the substrate W. Further, the edge (first edge) 212 is formed on the target 31a side with respect to the center of the slit unit 21. The edge (second edge) 213 is formed on the target 31b side with respect to the center of the slit unit 21. The edges 212 and 213 face each other. The edges 214 and 215 extend in the same direction as the transfer direction of the substrate W, and are formed outside the trajectory 500 of the transfer path of the substrate W. Further, a width between the edges 212 and 213, i.e., a width of the opening 211 in the transfer direction (i.e., the X direction) of the substrate W (an opening width in the lateral direction of the opening 211) is defined as W1.

FIG. 4B is an example of a plan view of the second plate 220. An example of the substrate W transferred by the substrate moving mechanism 50 is indicated by dashed double-dotted lines. Further, an example of the trajectory

500 of the transfer path of the substrate W transferred by the substrate moving mechanism 50 is indicated by dashed double-dotted lines.

The opening 221 has a substantially rectangular shape formed by edges 222 and 223 extending in the Y direction and edges 224 and 225 extending in the X direction. Further, the opening 221 has a substantially rectangular shape with the Y direction as a longitudinal direction and the X direction as a lateral direction. The edges 222 and 223 intersect with the trajectory 500 of the transfer path of the substrate W. Further, the edge (third edge) 222 is formed on the target 31*a* side with respect to the center of the slit unit 21. The edge (fourth edge) 223 is formed on the target 31*b* side with respect to the center of the slit unit 21. The edge 222 and the edge 223 face each other. The edges 224 and 225 extend in the same direction as the transfer direction of the substrate W, and are formed outside the trajectory 500 of the transfer path of the substrate W. Further, a width between the edges 222 and 223, i.e., a maximum width of the opening 221 in the transfer direction (i.e., the X direction) of the substrate W (an opening width of the opening 221 in the lateral direction) is defined as W2. The maximum width W2 of the opening 221 is greater than the width W1 of the opening 211 (W1<W2).

Further, a protrusion (first protrusion) 226 is formed at the center of the edge 222 in the Y direction (direction orthogonal to the transfer direction of the substrate W). The protrusion 226 protrudes from the edge 222 toward the opening 221, for example, to adjust the opening shape (or the opening area) of the opening 221. Further, a protrusion (second protrusion) 227 is formed at the center of the edge 223 in the Y direction (direction orthogonal to the transfer direction of the substrate W). The protrusion 227 protrudes from the edge 223 toward the opening 221, for example, to adjust the opening shape (or the opening area) of the opening 221. Further, a width between the protrusions 226 and 227, i.e., a minimum width of the opening 221 in the transfer direction (i.e., the X direction) of the substrate W is defined as W3. The minimum width W3 of the opening 221 is smaller than the width W1 of the opening 211 (W3<W1).

Figure 5:
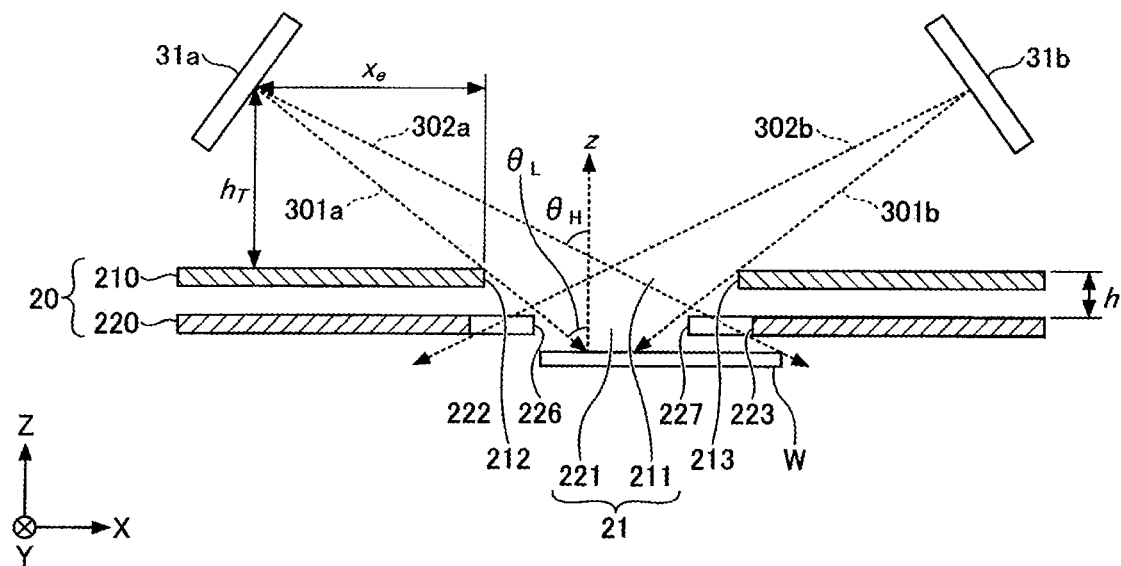
FIG. 5 is an example of a schematic cross-sectional view taken along a line V-V of a slit plate, a target, and a substrate W in the substrate processing apparatus according to the first embodiment.

FIG. 5 is an example of a schematic cross-sectional view taken along a line V-V of the slit plate 20, the targets 31*a* and 31*b*, and the substrate W in the substrate processing apparatus 1 according to the first embodiment. Further, examples of the trajectories 301*a* and 302*a* of the sputter particles emitted from the target 31*a* are indicated by dashed arrows. Examples of the trajectories 301*b* and 302*b* of the sputter particles emitted from the target 31*b* are indicated by dashed arrows.

The trajectory 301*a* of the sputter particles is the trajectory of the sputter particles that are incident on the surface of the substrate W through the edge 212 from the central position of the surface of the target 31*a* that emits the sputter particles. Here, the axis perpendicular to the surface of the substrate W is defined as the Z-axis. Further, the angle formed by the Z-axis and the trajectory 301*a* is set to θL. In other words, the angle θL is the minimum incident angle among the incident angles of the sputter particles incident on the substrate W from the target 31*a*.

Here, the horizontal distance in the transfer direction (i.e., the X direction) of the substrate W from the edge 212 of the opening 211 to the central position of the surface of the target 31*a* that emits the sputter particles is set to $x_e$. Further, the height from the upper surface of the first plate 210 to the central position of the surface of the target 31*a* that emits the sputter particles is defined as $h_T$. The minimum incident angle $\theta_L$ is expressed by Eq. (1) using the horizontal distance $x_e$ and the height $h_T$.

$$\tan \theta_L = h_T/x_e \qquad \text{Eq. (1)}$$

The trajectory 302*a* of the sputter particles is the trajectory of the sputter particles that are incident on the surface of the substrate W through the edge 223 from the central position of the surface of the target 31*a* that emits the sputter particles. Here, the angle formed by the Z-axis and the trajectory 302*a* is set to θH. In other words, the angle θH is the maximum incident angle among the incident angles of the sputter particles incident on the substrate W from the target 31*a*.

Similarly, the trajectory 301*b* of the sputter particles is the trajectory of the sputter particles that are incident on the surface of the substrate W through the edge 213 from the center position of the surface of the target 31*b* that emits the sputter particles. Here, the angle formed by the Z-axis and the trajectory 301*b* is the minimum incident angle among the incident angles of the sputter particles incident on the substrate W from the target 31*b*.

The trajectory 302*b* of the sputter particles is the trajectory of the sputter particles that are incident on the surface of the substrate W through the edge 222 from the center position of the surface of the target 31*b* that emits the sputter particles. Here, the angle formed by the Z-axis and the trajectory 302*b* is the maximum incident angle among the incident angles of the sputter particles incident on the substrate W from the target 31*b*.

In other words, the opening 211 of the first plate 210 defines the minimum incident angle θL among the incident angles of the sputter particles incident on the substrate W from the targets 31*a* and 31*b*. Further, the opening 221 of the second plate 220 defines the maximum incident angle θH among the incident angles of the sputter particles incident on the substrate W from the targets 31*a* and 31*b*.

Here, the distance between the upper surface of the first plate 210 and the upper surface of the second plate 220 is set to h. When the relationship of Eq. (2) is satisfied, the edge 222 becomes a shadow of the slit plate 20 (the first plate 210) when viewed from the target 31*a*.

$$h \geq (W1-W3)/(2 \tan \theta_L) \qquad \text{Eq. (2)}$$

Figure 6:
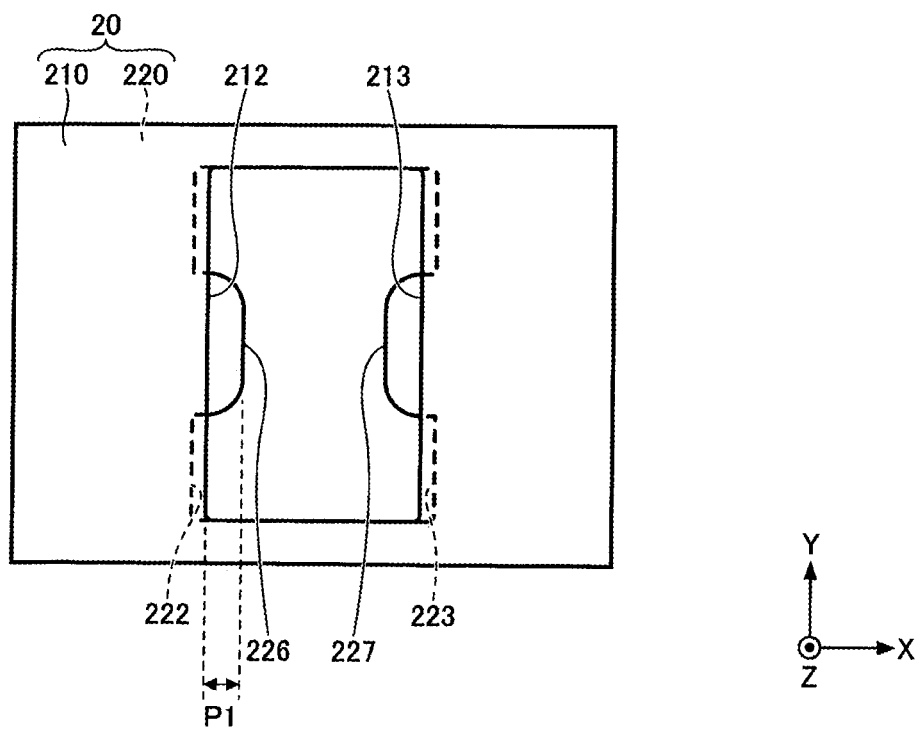
FIG. 6 is an example of a plan view of a slit plate in the substrate processing apparatus according to the first embodiment.

FIG. 6 is an example of a plan view of the slit plate 20 in the substrate processing apparatus 1 according to the first embodiment. In the example shown in FIG. 6, the protrusion 226 protruding from the edge 222 of the second plate 220 protrudes more than the edge 212 of the first plate 210.

Here, the amount of protrusion of the protrusion 226 from the edge 222 in the transfer direction (i.e., the X direction) of the substrate W is defined as P1. When the relationship of Eq. (3) is satisfied, the protrusion 226 becomes a shadow of the slit plate 20 (the first plate 210) when viewed from the target 31*a*.

$$P1 \leq h \tan \theta_L \qquad \text{Eq. (3)}$$

Figure 7A:
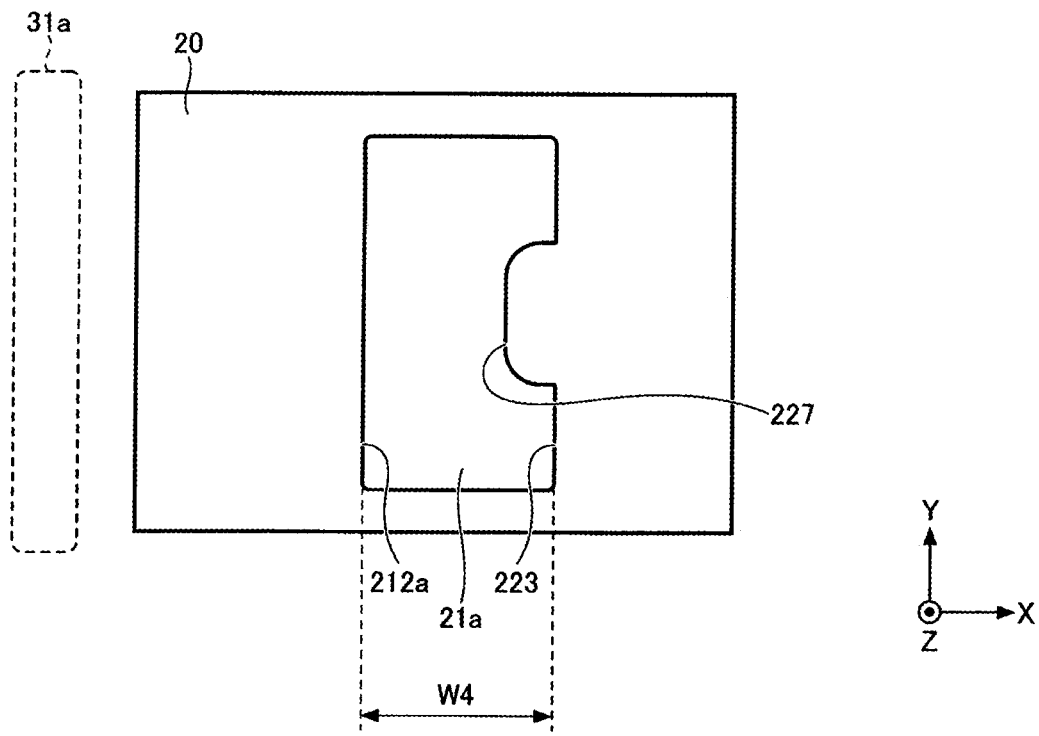
FIGS. 7A and 7B are examples of a plan view showing a shape of a slit unit viewed from each target in the substrate processing apparatus according to the first embodiment.
Figure 7B:
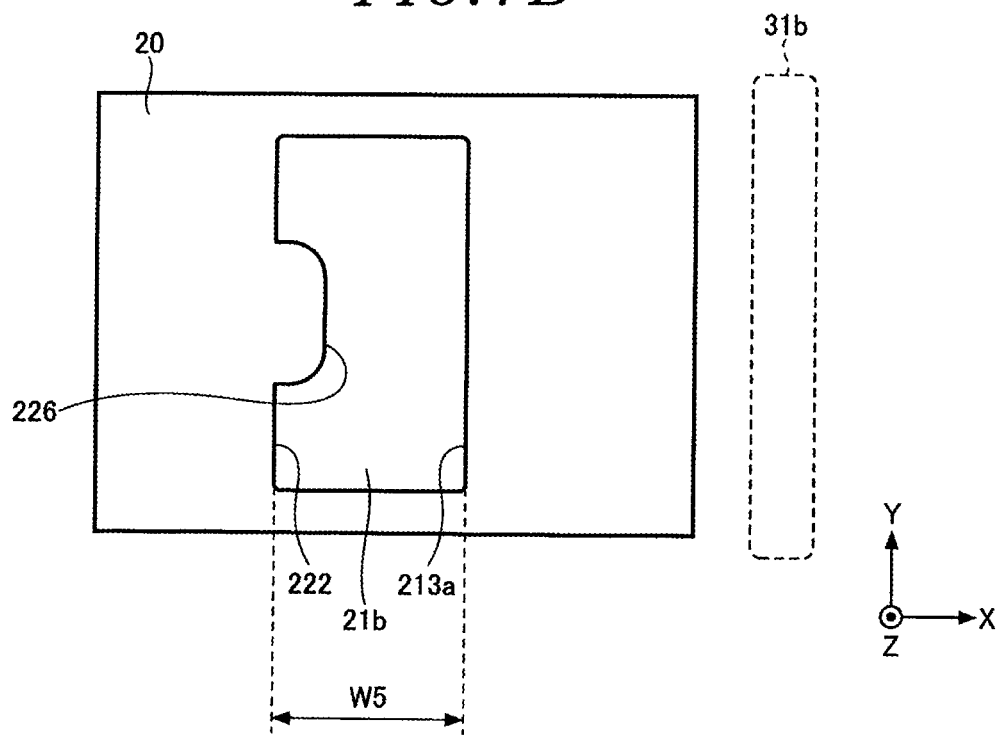

FIGS. 7A and 7B are examples of a plan view showing the shape of the slit unit 21 of the slit plate 20 when viewed from the targets 31*a* and 31*b* in the substrate processing apparatus 1 according to the first embodiment. Here, the case where the slit plate 20 satisfies the relationship of Eqs. (2) and (3) will be described as an example.

FIG. 7A shows a slit shape 21*a* in the case where the slit unit 21 of the slit plate 20 is viewed from the target 31*a*. Here, the edge 212*a* coincides with the edge 212 viewed from the target 31*a* projected on the upper surface of the second plate 220. As shown in FIG. 7A, the edge 222 and the protrusion 226 are hidden when viewed from the target 31a. In the slit shape 21a, a maximum width W4 in the transfer direction (i.e., the X direction) of the substrate W corresponds to the distance between the edge 212a and the edge 223.

FIG. 7B shows a slit shape 21b in the case where the slit unit 21 of the slit plate 20 is viewed from the target 31b. Here, the edge 213a coincides with the edge 213 viewed from the target 31b projected on the upper surface of the second plate 220. As shown in FIG. 7B, the edge 223 and the protrusion 227 are hidden when viewed from the target 31b. In the slit shape 21b, a maximum width W5 in the transfer direction (i.e., the X direction) of the substrate W corresponds to the distance between the edge 213a and the edge 222.

As described above, in the substrate processing apparatus 1 according to the first embodiment, the range of the incident angle of the sputter particles incident on the substrate W from the target 31a can be adjusted by adjusting the edge 212 and the edge 223. Further, by adjusting the edge 213 and the edge 222, the range of the incident angle of the sputter particles emitted from the target 31b to the substrate W can be adjusted.

In the substrate processing apparatus 1 according to the first embodiment, the edges 212 and 223 for adjusting the incident angle from the target 31a are different from the edges 213 and 222 for adjusting the incident angle from the target 31b. Therefore, it is possible to independently adjust the range of the incident angle of the sputter particles incident on the substrate W from the target 31a and the range of the incident angle of the sputter particles incident on the substrate W from the target 31b. In other words, when the range of the incident angle of the sputter particles incident on the substrate W from the target 31a is adjusted, the range of the incident angle of the sputter particles incident on the substrate W from the target 31b is not affected. When the range of the incident angle of the sputter particles incident on the substrate W from the target 31b is adjusted, the range of the incident angle of the sputter particles incident on the substrate W from the target 31a is not affected. Accordingly, the slit plate 20 of the substrate processing apparatus 1 according to the first embodiment can improve the controllability of adjusting the incident angle.

Further, in the substrate processing apparatus 1, the sputter particles are emitted from the targets 31a and 31b in all directions, and the sputter particles that have passed through the slit unit 21 of the slit plate 20 are incident on the substrate W moving in the transfer direction (i.e., the X direction). Therefore, the incident amount of the sputter particles becomes non-uniform in the direction (i.e., the Y direction) orthogonal to the transfer direction (i.e., the X direction) of the substrate W. Specifically, in the Y direction, the film thickness is thick at the central portion due to the deposition of the sputter particles and the film thickness is thin at the outer portion.

By forming the protrusion 227 at the central portion of the edge 223, it is possible to reduce the incident amount of the sputter particles incident on the central portion in the Y direction among the sputter particles deposited on the substrate W from the target 31a through the slit unit 21 (the slit shape 21a). Accordingly, the uniformity of the film thickness between the central portion and the outer portion in the Y direction can be improved. Further, by forming the protrusion 226 at the central portion of the edge 222, it is possible to reduce the incident amount of the sputter particles incident on the central portion in the Y direction among the sputter particles deposited on the substrate W from the target 31b through the slit unit 21 (the slit shape 21b). Accordingly, the uniformity of the film thickness between the central portion and the outer portion in the Y direction can be improved.

Further, in the substrate processing apparatus 1 according to the first embodiment, the protrusion 226 for adjusting the uniformity of the film thickness by the sputter particles from the target 31a is different from the protrusion 227 for adjusting the uniformity of the film thickness by the sputter particles from the target 31b. Therefore, the adjustment of the film thickness uniformity by the sputter particles from the target 31a and the adjustment of the film thickness uniformity by the sputter particles from the target 31b can be independently performed.

In other words, the protrusion 227 is hidden when viewed from the target 31b. Therefore, when the adjustment of the uniformity of the film thickness by the sputter particles from the target 31a is performed by adjusting the protrusion 227, the adjustment of the unifoiiiiity of the fihn thickness by the sputter particles from the target 31b is not affected. Similarly, the protrusion 226 is hidden when viewed from the target 31a. Therefore, when the adjustment of the uniformity of the film thickness by the sputter particles from the target 31b is performed by adjusting the protrusion 226, the adjustment of the uniformity of the film thickness by the sputter particles from the target 31a is not affected. Accordingly, the slit plate 20 of the substrate processing apparatus 1 according to the first embodiment can improve the controllability of adjusting the uniformity of the film thickness.

Although the case where the protrusions 226 and 227 are formed at the opening 221 of the second plate 220 has been described, the protrusions 226 and 227 may be formed at the opening 211 of the first plate 210 without being limited thereto. Further, it is preferable to form the protrusions 226 and 227 at a portion close to the substrate W, i.e., at the opening 221 of the second plate 220 in this example. The variation in the film thickness with respect to the amount of protrusion of the protrusions 226 and 227 increases as the distance in the height direction from the substrate W to the protrusions 226 and 227 increases. Therefore, by forming the protrusions 226 and 227 at the portion close to the substrate W, i.e., at the opening 221 of the second plate 220 in this example, the resolution for adjusting the uniformity of the film thickness can be improved.

Although the case where the slit plate 20 includes two plates (the first plate 210 and the second plate 220) has been described, the shape of the slit plate 20 is not limited thereto.

Slit Plate 20A of the Second Embodiment

Figure 8:
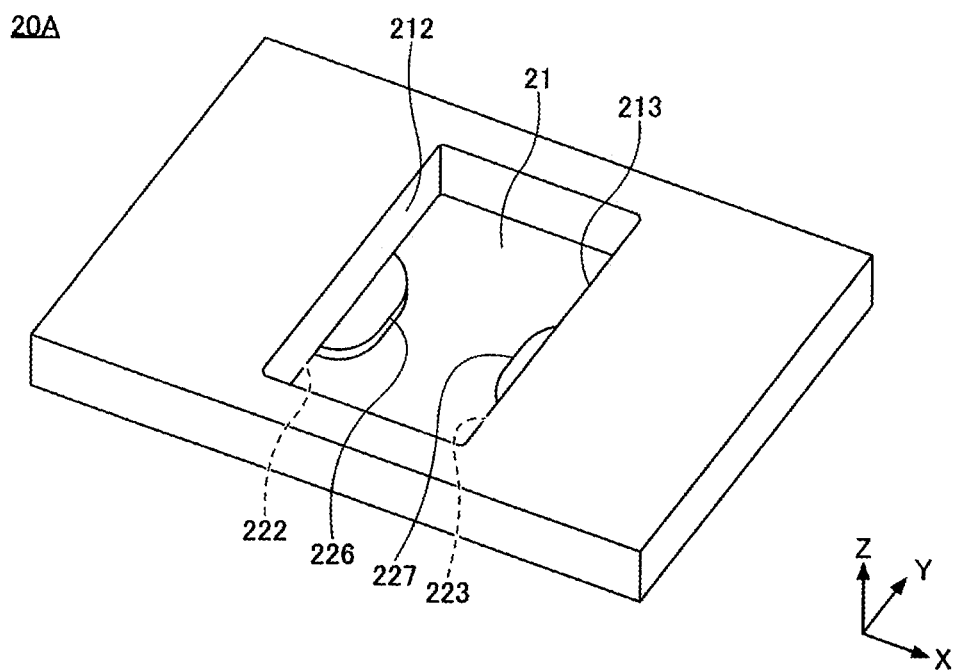
FIG. 8 is a perspective view showing an example of a slit plate in a substrate processing apparatus according to a second embodiment.
Figure 9:
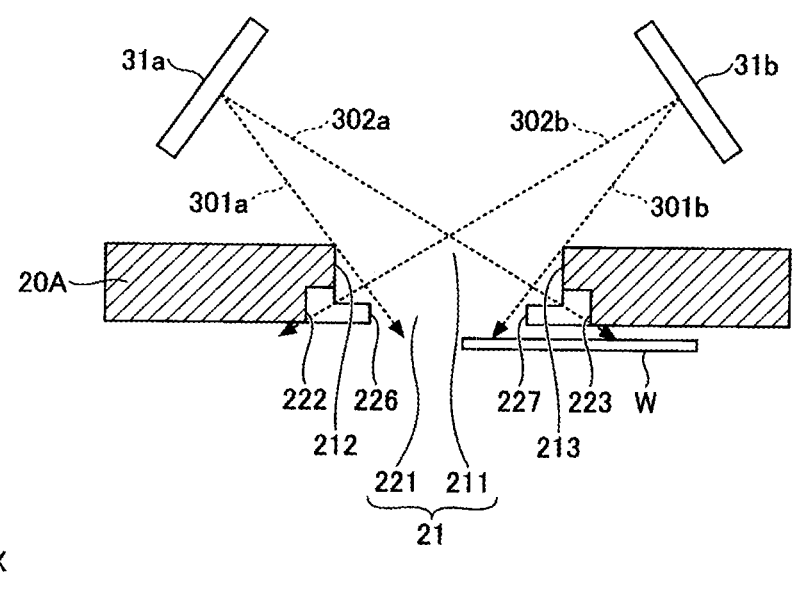
FIG. 9 is an example of a schematic cross-sectional view of a slit plate, a target, and a substrate W in the substrate processing apparatus according to the second embodiment.

Next, a slit plate 20A of the substrate processing apparatus 1 according to the second embodiment will be described with reference to FIGS. 8 and 9. FIG. 8 is a perspective view showing an example of the slit plate 20A in the substrate processing apparatus 1 according to the second embodiment. FIG. 9 is an example of a schematic cross-sectional view of the slit plate 20A, the targets 31a and 31b, and the substrate W in the substrate processing apparatus 1 according to the second embodiment.

The slit plate 20A is formed as a thick plate member. The slit plate 20A has a slit unit 21 penetrating through the slit plate 20A in a plate thickness direction thereof. An opening 211 is formed on the upper surface side of the slit unit 21. An opening 221 is formed on the bottom surface side of the slit unit 21.

Slit Plate 20B of the Third Embodiment

Figure 10:
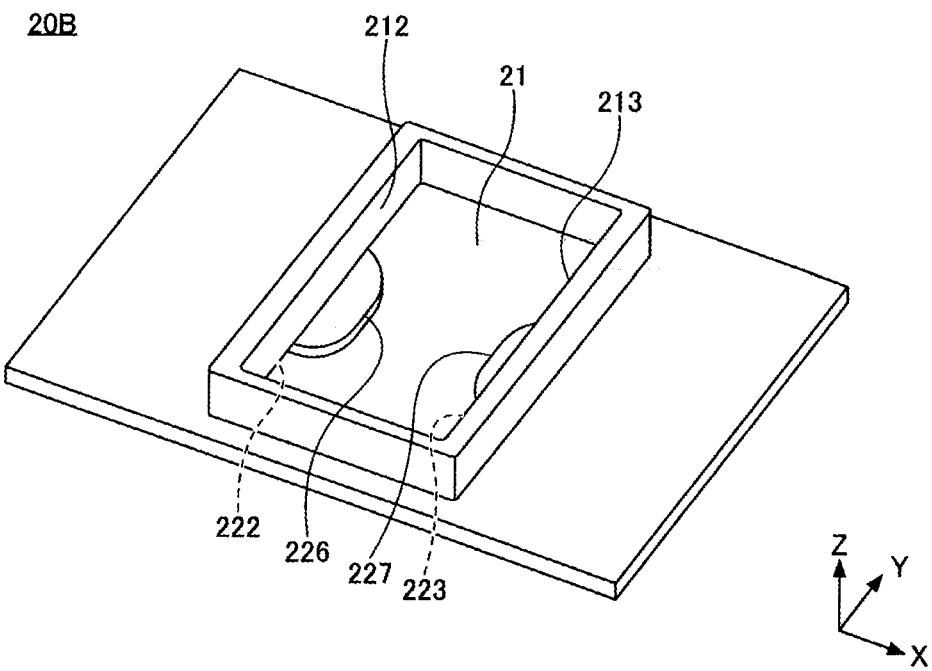
FIG. 10 is a perspective view showing an example of a slit plate in a substrate processing apparatus according to a third embodiment.
Figure 11:
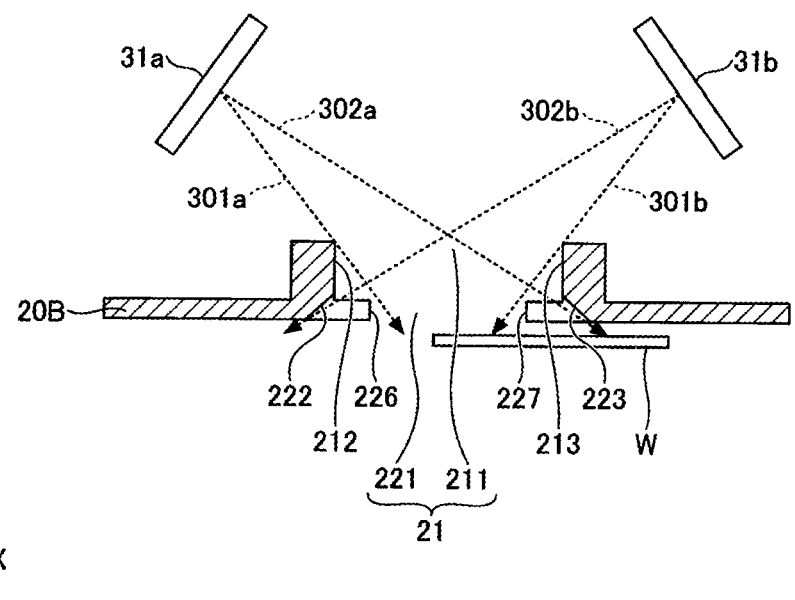
FIG. 11 is an example of a schematic cross-sectional view of the slit plate, a target, and a substrate W in the substrate processing apparatus according to the third embodiment.

Next, a slit plate 20B of the substrate processing apparatus 1 according to the third embodiment will be described with reference to FIGS. 10 and 11. FIG. 10 is a perspective view showing an example of the slit plate 20B in the substrate processing apparatus 1 according to the third embodiment. FIG. 11 is an example of a cross-sectional view of the slit plate 20B, the targets 31a and 31b, and the substrate W in the substrate processing apparatus 1 according to the third embodiment.

The slit plate 20B has a plate portion and a boss portion projecting upward from the plate portion. The slit plate 20B has a slit unit 21 penetrating through the plate portion and the boss portion in the plate thickness direction. The opening 211 is formed on the upper surface side of the slit unit 21. The opening 221 is formed on the bottom surface side of the slit unit 21.

Slit Plate 20C of the Fourth Embodiment

Figure 12:
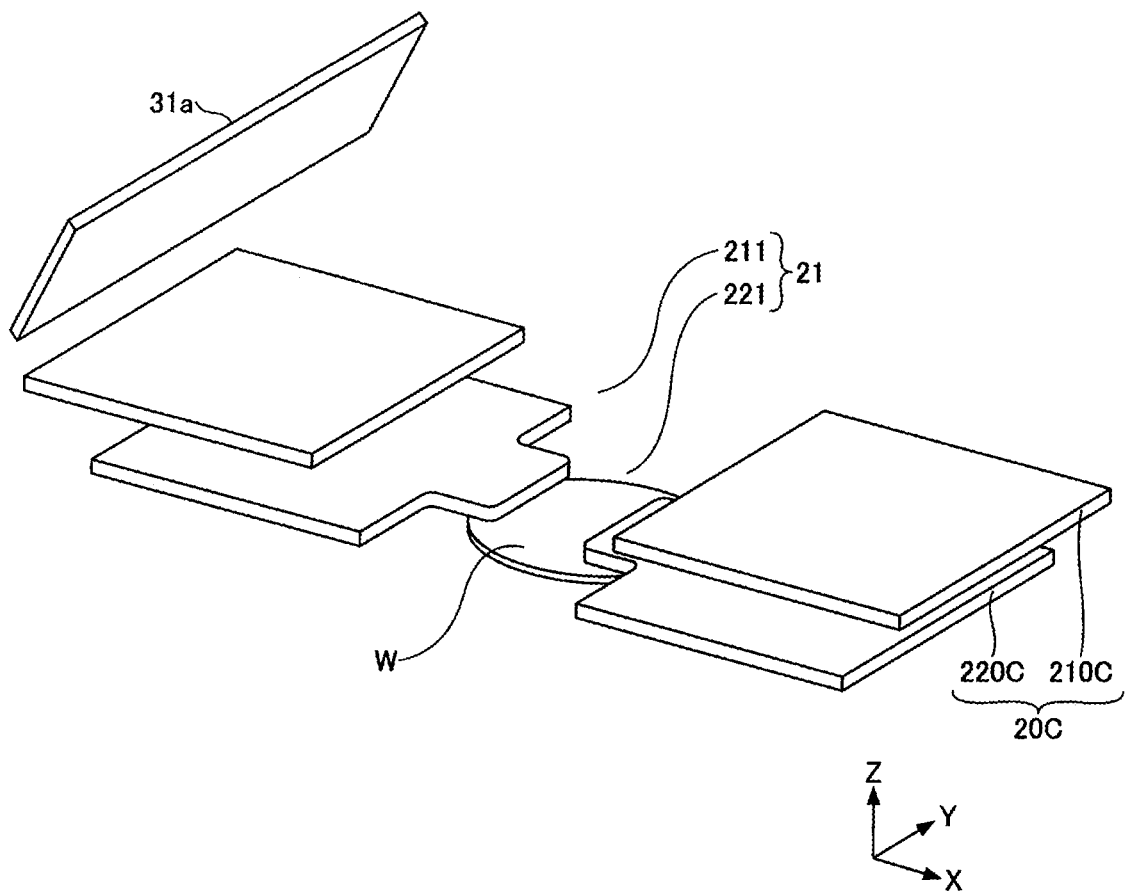
FIG. 12 is a perspective view showing an example of a slit plate, a target, and a substrate in a substrate processing apparatus according to a fourth embodiment.

Next, a slit plate 20C of the substrate processing apparatus 1 according to the fourth embodiment will be described with reference to FIG. 12. FIG. 12 is a perspective view showing an example of the slit plate 20C, the target 31a, and the substrate W in the substrate processing apparatus 1 according to the fourth embodiment. In FIG. 12, the target 31b is not shown.

The slit plate 20C has a first plate assembly 210C and a second plate assembly 220C. The first plate assembly 210C has two plates arranged on the same plane. The two plates are separated from each other in the transfer direction (i.e., the X direction) of the substrate W, and the opening 211 is formed therebetween. The second plate assembly 220C has two plates arranged on the same plane. The two plates are separated from each other in the transfer direction (i.e., the X direction) of the substrate W, and the opening 221 is formed therebetween.

Although the substrate processing apparatus 1 has been described above, the present disclosure is not limited to the above-described embodiments, and various modifications and modifications can be made without departing from the scope of the appended claims and the gist thereof.

Although the case where the substrate processing apparatus 1 has two targets 31a and 31b has been described, the substrate processing apparatus 1 may have three or more targets without being limited thereto.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A sputtering apparatus comprising:
a first target and a second target that emit sputter particles;
a substrate support configured to support a substrate; and
a slit plate disposed between the first and the second targets and the substrate and having a slit unit through which the sputter particles pass,
wherein the slit unit includes a first slit to aside of the first and the second target and a second slit to a side of the substrate,
the second slit has a first protrusion and a second protrusion protruding toward a center of the second slit, the first and second protrusions protruding from edges that define the second slit,
when the slit unit is viewed from the first target, the first protrusion is hidden, and
when the slit unit is viewed from the second target, the second protrusion is hidden.

2. The sputtering apparatus of claim 1, further comprising:
a substrate moving mechanism configured to move the substrate supported by the substrate support in a sliding direction,
wherein the first target and the second target are arranged in the sliding direction of the substrate and inclined toward the slit unit.

3. The sputtering apparatus of claim 1, wherein the first slit limits a minimum incident angle of the sputter particles incident on the substrate from the first target and the second target, and
the second slit limits a maximum incident angle of the sputter particles incident on the substrate from the first target and the second target.

4. The sputtering apparatus of claim 1, wherein an opening width in a lateral direction of the first slit is set to W1; an opening width in a lateral direction of the second slit is set to W2; and an opening width between the first protrusion and the second protrusion of the second slit is set to W3, such that W2>W1 and W3<W1.

5. The sputtering apparatus of claim 3, wherein the slit plate includes a first plate having the first slit and a second plate having the second slit.

6. The sputtering apparatus of claim 5, wherein the minimum incident angle is set to θL and a distance between an upper surface of the first plate and an upper surface of the second plate is set to h, such that h≥(W1−W3)/(2tan θL).

7. The sputtering apparatus of claim 1, wherein the slit plate is formed as a single member having the first slit and the second slit.

8. The sputtering apparatus of claim 1, wherein the slit plate includes:
a first plate assembly in which two plates are spaced apart to form the first slit; and
a second plate assembly in which two plates are spaced apart to form the second slit.

9. The sputtering apparatus of claim 1, wherein the first slit has a first edge and a second edge intersecting with a sliding direction of the substrate,
the second slit has a third edge and a fourth edge intersecting with the sliding direction of the substrate,
the first edge faces the second edge,
the third edge faces the fourth edge,
the first protrusion protrudes from the third edge,
the second protrusion protrudes from the fourth edge,
a shape of the slit of the slit plate viewed from the first target is defined by the first edge and the fourth edge having the second protrusion, and
a shape of the slit of the slit plate viewed from the second target is defined by the second edge and the third edge having the first protrusion.

10. A film forming method of a sputtering apparatus including a first target and a second target that emit sputter particles, a substrate support configured to support a substrate, and a slit plate disposed between the first and the second targets and the substrate and having a slit unit through which the sputter particles pass, wherein the slit unit includes a first slit to the first and the second target side and a second slit to the substrate side; the second slit has a first protrusion and a second protrusion protruding toward a center of the second slit, the first and second protrusions protruding from edges that define the second slit; when the slit unit is viewed from the first target, the first protrusion is hidden; and when the slit unit is viewed from the second target, the second protrusion is hidden, the film forming method comprising:

emitting sputter particles from the first target and selectively forming a film on the substrate.

11. The film forming method of claim 10, further comprising:

emitting sputter particles from the second target and selectively forming a film on the substrate.

12. The film forming method of claim 10, wherein the first target and the second target are made of different materials.

* * * * *